(12) United States Patent
Lee et al.

(10) Patent No.: US 6,339,533 B1
(45) Date of Patent: Jan. 15, 2002

(54) HEAT DISSIPATING ASSEMBLY

(75) Inventors: Hsieh Kun Lee, Chung-Ho (TW); ZhiSheng Lin, ShenZhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/690,107

(22) Filed: Oct. 16, 2000

(30) Foreign Application Priority Data

Sep. 14, 2000 (TW) ...................................... 89215867 U

(51) Int. Cl.⁷ ................................................ H05K 7/20
(52) U.S. Cl. ....................... 361/704; 165/80.3; 165/185; 257/719; 257/727; 174/16.3; 24/458; 248/510
(58) Field of Search .......................... 24/455, 458, 567, 24/570; 165/80.2, 80.3, 185; 174/16.3; 257/706–707, 712–713, 718–719, 726–727; 361/690, 704, 707, 709–710, 715, 719–720; 248/505, 510

(56) References Cited

U.S. PATENT DOCUMENTS 6,250,375 B1 * 1/2000 Lee et al. ................... 361/704
6,205,026 B1 * 3/2001 Wong et al. ................. 361/704

* cited by examiner

*Primary Examiner*—Gregory Thompson
(74) *Attorney, Agent, or Firm*—Wei Te Chung

(57) ABSTRACT

A heat dissipating assembly (30) includes a heat sink (50), a pair of clips (40) and a pair of retention modules (60). The heat sink includes a chassis defining a pair of slots (56) near respective opposite ends thereof. Each retention module forms a pair of catches (62) at respective opposite ends thereof. Each clip includes a central pressing portion (41), a pair of spring sections (42), and a pair of legs (44). A wing (412) depends from an edge of the pressing portion, for engaging with an outer wall of the corresponding retention module. A tab (414) depends from the pressing portion 41 opposite the wing, to be received in the corresponding slot. Each leg defines an opening (48) for insertion of a tool therethrough, and a hole (46) adapted to receive the catch of the corresponding retention module. Thus the heat sink is securely attached to an electronic device (80).

9 Claims, 4 Drawing Sheets

HEAT DISSIPATING ASSEMBLY

THE BACKGROUND OF THE INVENTION

1. The Field of the Invention

The present invention relates to a heat dissipating assembly for a heat generating electronic device, and more particularly to a heat dissipating assembly having clips for securing a heat sink to the electronic device.

2. The Related Art

Many electronic devices, such as Central Processing Units (CPUs), generate a lot of heat during normal operation. The heat must be quickly removed, to avoid destabilization of operation or damage to the device. Generally, a heat dissipating assembly is mounted on a top surface of the electronic device, for removing heat therefrom.

Referring to FIG. 4, a conventional heat dissipating assembly includes a heat sink 2 and a clip 1 for attaching the heat sink 2 to an electronic device 3 mounted on a retention module 4. The heat sink 2 defines a central channel 22 therethrough, for receiving the clip 1. The clip 1 includes a central horizontal support portion 12, a pair of inclined spring sections 14 extending from respective opposite ends of the support portion 12, and a pair of legs 16 depending from respective distal ends of the spring sections 14. Each leg 16 defines an aperture 162 corresponding to a catch 24 of the retention module 4. A pair of handles 18 is formed on each leg 16, for facilitating assembly and disassembly.

However, the clip 1 is long, which reduces its resilient strength. Thus the heat sink 2 cannot be securely fastened to the electronic device 3 by the clip 1.

Furthermore, to meet increasing demands for dissipation of ever-increasing amounts of heat, larger and larger heat sinks are being manufactured. A pair of retention modules is required to secure such large heat sink. A pair of clips is required on respective opposite sides of the heat sink, for engaging with the retention modules. This kind of conventional assembly attaches the heat sink to the electronic device. A pressing point of the clip, which acts on the heat sink, usually does not coincide with the center of the clip. Therefore, an eccentric moment can occur between the pressing point and the center of the clip. This can result in the heat sink dislodging from the electronic device when the assembly is subjected to shock or vibration during normal operation.

Examples of conventional clips are disclosed in Taiwan Patents Nos. 268622 and 246982.

SUMMARY OF THE INVENTION

Accordingly, an object of the present invention is to provide a heat dissipating assembly which is securely attached to an electronic device.

To achieve the above object, a heat dissipating assembly includes a heat sink, a pair of clips and a pair of retention modules. The heat sink includes a chassis defining a pair of slots near respective opposite sides thereof. Each retention module forms a pair of catches at respective opposite ends thereof. Each clip includes a central pressing portion, a pair of spring sections, and a pair of legs. A wing depends from a lateral edge of the pressing portion, for engaging an outer side surface of the corresponding retention module. A tab depends from the pressing portion opposite the wing, to be received in the corresponding slot of the heat sink. Each leg defines an opening for insertion of a tool therethrough, and a hole adapted to receive the catch of the corresponding retention module.

Other objects, advantages and novel features of the present invention will be drawn from the following detailed embodiment of the present invention with attached drawings, in which:

DESCRIPTION OF THE PREFERRED EMBODIMENT

Figure 1:
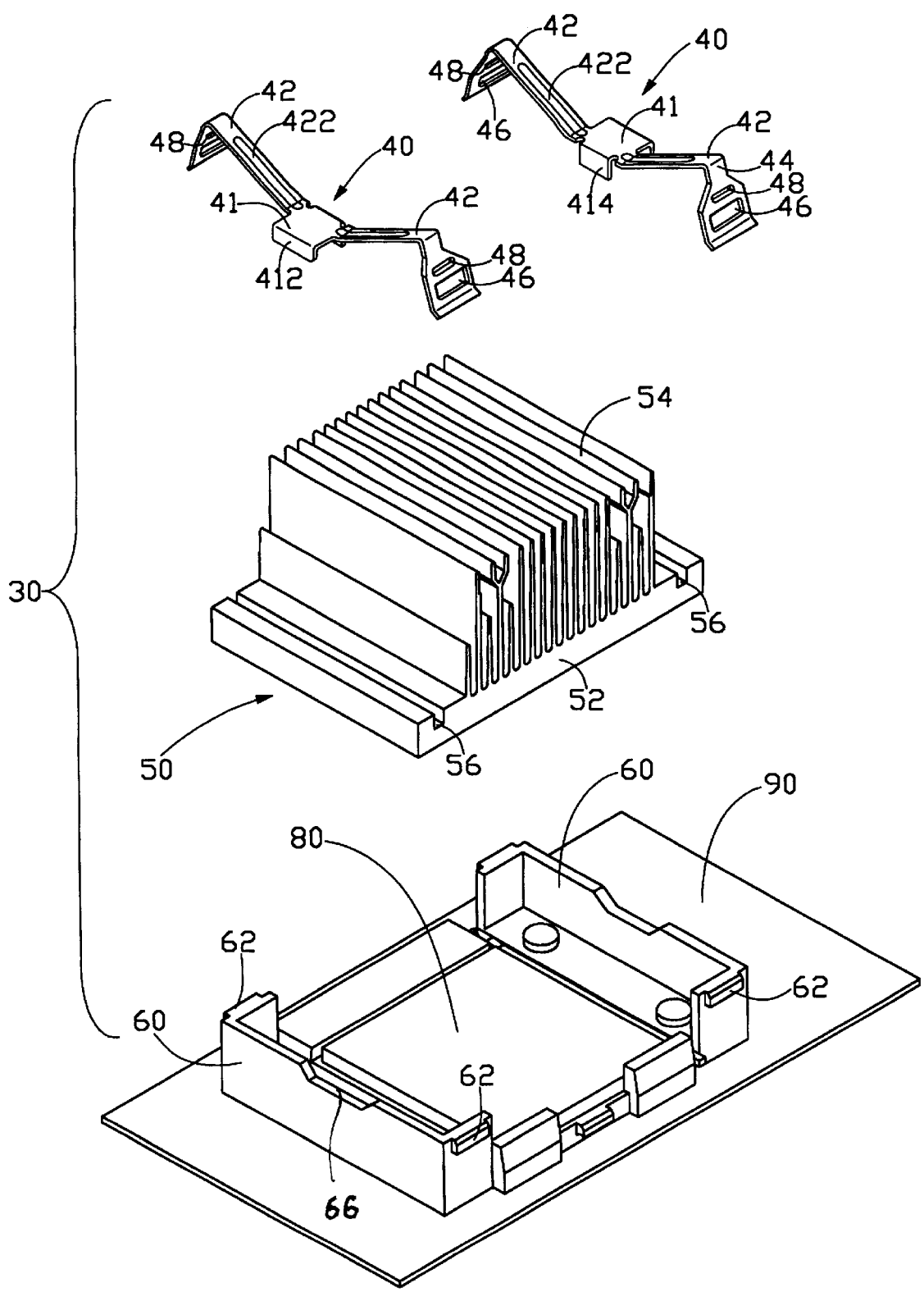
FIG. 1 is an exploded view of a heat dissipating assembly in accordance with the present invention.

Referring to FIG. 1, a heat dissipating assembly 30 comprises a heat sink 50, a pair of retention modules 60 and a pair of clips 40. The clips 40 and the retention modules 60 serve to securely attach the heat sink 50 to a top surface of an electronic device 80 mounted on a printed circuit board 90.

The heat sink 50 includes a chassis 52 and a plurality of fins 54. The fins 54 extend upwardly from an upper surface of the chassis 52. A pair of slots 56 is defined in the upper surface of the chassis 52 on respective opposite sides of the plurality of fins 54.

Each of the retention modules 60 is generally U-shaped, and forms a pair of external catches 62 on respective opposite ends thereof. The two retention modules 60 are disposed on respective opposite sides of the electronic device 80, to define a receiving space (not labeled) for receiving the heat sink 50 therein. The electronic device 80 and retention modules 60 are all secured to the PCB 90 by conventional means. A notch 66 is formed in the middle of the upper portion of the retention module 60.

Figure 2:
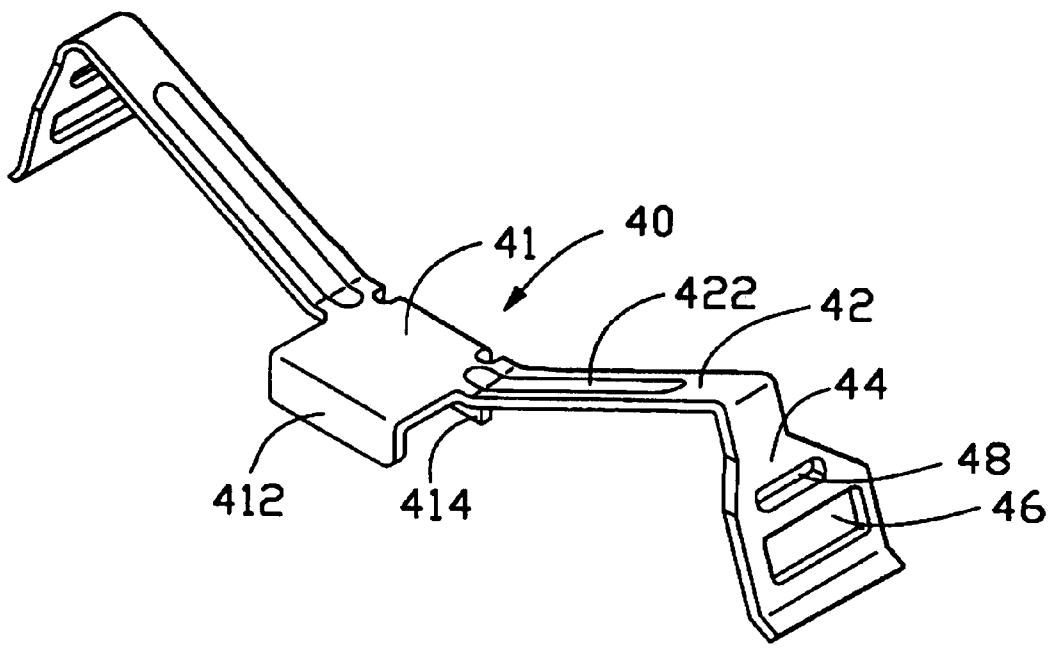
FIG. 2 is a perspective view of a clip of the heat dissipating assembly in accordance with the present invention.

Referring also to FIG. 2, each clip 40 is formed from a single plate. Each clip 40 comprises a central pressing portion 41, a pair of spring sections 42, and a pair of legs 44. The spring sections 42 extend outwardly and upwardly from respective opposite ends of the pressing portion 41. The legs 44 extend downwardly and outwardly from respective distal ends of the spring sections 42.

A wing 412 depends from a lateral edge of the pressing portion 41. A tab 414 depends from an opposite lateral edge of the pressing portion 41. A rib 422 is formed at each spring section 42, to reinforce the clip 40. Each leg 44 defines an opening 48, and a hole 46 below the opening 48.

Figure 3:
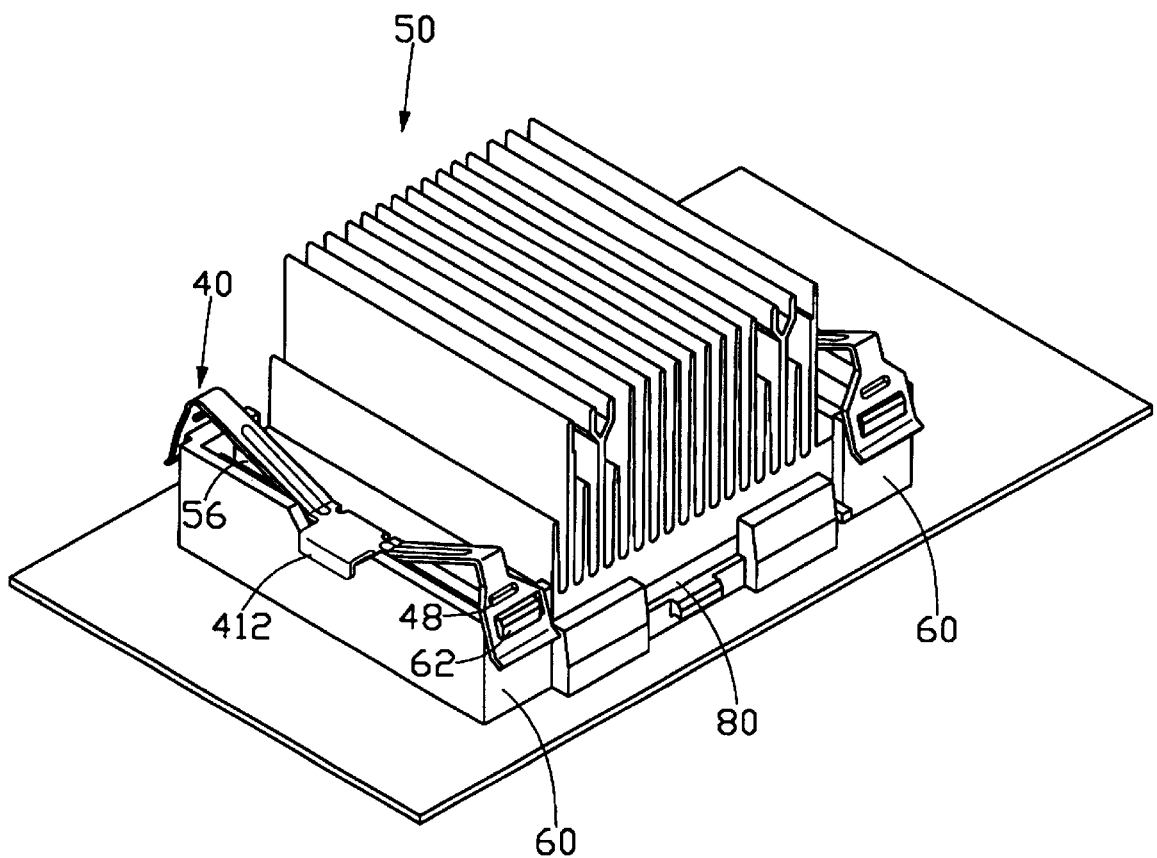
FIG. 3 is an assembled view of the FIG. 1.
Figure 4:
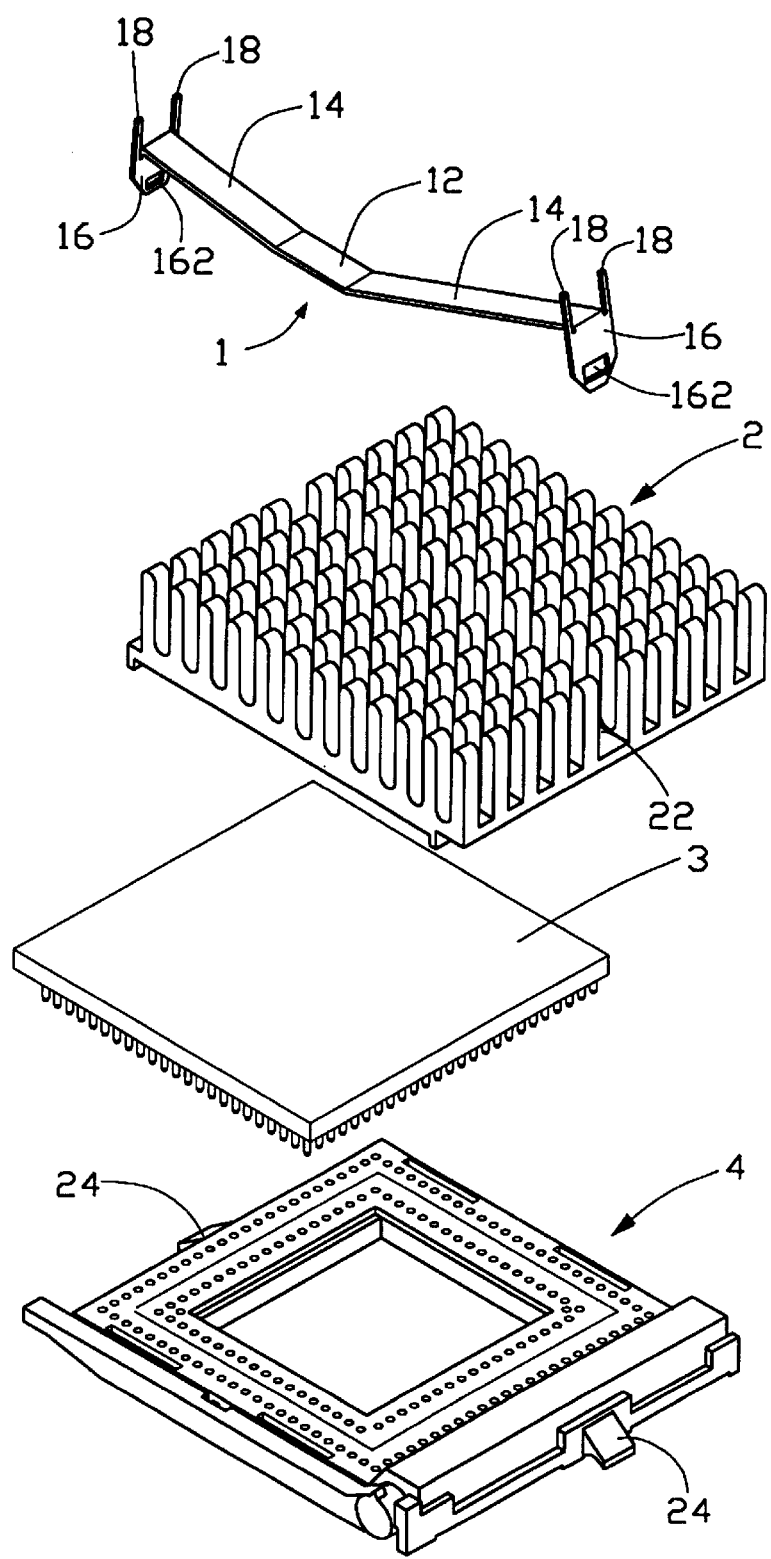
FIG. 4 is an exploded view of a conventional heat dissipating assembly.

Referring to FIGS. 1–3, in assembly, the heat sink 50 is received in the space (not labeled) defined by the retention modules 60, and is placed on a top surface of the electronic device 80. The clips 40 are then placed on the respective retention modules 60. One catch 62 of each retention module 60 is received in the hole 46 of one leg 44 of the corresponding clip 40. A tool such as an opener (not shown) is inserted into the opening 48 of the other leg 44 of the same corresponding clip 40. The opener is then depressed to cause the other leg 44 to move downwardly. The other leg 44 is moved downwardly until the other catch 62 of the retention module 60 is resiliently received in the hole 46 of the other leg 44 of the same corresponding clip 40.

The bottom surface of the pressing portion 41 of each clip 40 resiliently abuts the upper surface of the chassis 52 of the heat sink 50. The tab 414 of each clip 40 is received in the corresponding slot 56 of the heat sink 50, and abuts a vertical surface (not labeled) of the chassis 52 which defines an outer limit of the slot 56. The wing 412 of each clip 40 abuts an outer side surface (not labeled) of the corresponding retention module 60.

The pressing portion 41 of each clip 40 resiliently abutting the upper surface of the chassis 52 of the heat sink 50 prevents the heat sink 50 from moving in any vertical direction relative to the electronic device 80. A side portion of the pressing portion 41 is generally restricted in the notch 66 for preventing the pressing portion 41 from moving in a longitudinal direction of the clip 40. The legs 44 of each clip 40 resiliently engaging with the catches 62 of each retention module 60 prevents the heat sink 50 from moving in a first horizontal direction. The tab 414 of each clip 40 abutting a vertical surface (not labeled) of the chassis 52 which defines an outer limit of the slot 56 of the heat sink 50, and the wing 412 of each clip 40 abutting an outer side surface (not labeled) of the retention module 60, together prevent the heat sink 50 from moving in a second horizontal direction normal to the first horizontal direction. Thus the heat sink 50 is securely attached to the top surface of the electronic device 80.

In disassembly, the opener (not shown) is inserted into an opening 48 of a leg 44 of each clip 40. The opener (not shown) is depressed until the catch 62 disengages from the hole 46 of the clip 40. The leg 44 of the clip 40 is thereby released from the catch 62 of the retention module 60. The other leg 44 of the clip 40 is then easily removed from the other catch 62 of the retention module 60. Thus the heat sink 50 is readily removed from the electronic device 80.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipating assembly adapted to remove heat from an electronic device, comprising:
   a heat sink adapted to be in thermal contact with the electronic device;
   two retention modules adapted to be arranged on respective opposite sides of the electronic device, each module forming a pair of catches at respective opposite ends thereof, and a notch in a middle of an upper portion thereof; and
   two clips, each clip comprising a pressing portion for pressing the heat sink onto the electronic device, two legs extending at respective opposite ends thereof, each leg defining a hole for engaging the catch of the corresponding retention module thereby fixing the each clip to its corresponding retention module and thus securing the heat sink to the electronic device, an opening being defined in each of the legs for facilitating assembly and disassembly of each clip and its corresponding retention module, a wing being downwardly formed from a side of the pressing portion for abutting an outer side surface of the corresponding retention module, the pressing portion having a side portion near the wing, the side portion being received within the corresponding notch, thereby preventing the each clip from moving along a longitudinal direction thereof.

2. The heat dissipating assembly as recited in claim 1, wherein the heat sink has a chassis defining two slots near respective opposite sides thereof, the pressing portion of the each clip forming a tab adapted to engage with the corresponding slot of the heat sink, thereby preventing the heat sink from moving in a horizontal direction.

3. The heat dissipating assembly as recited in claim 1, wherein two spring sections extend from respective opposite ends of the pressing portion of each clip.

4. The heat dissipating assembly as recited in claim 3, wherein at least a rib is formed on at least one of the spring sections of at least one of the clips, to reinforce the at least one of the clips.

5. The heat dissipating assembly as recited in claim 1, wherein the side portion of the pressing portion of the each clip is horizontal.

6. A heat dissipating assembly comprising:
   a heat sink positioned upon an electronic device;
   a pair of retention modules positioned by two sides of the electronic device, each of said modules defining a pair of catches at two respective opposite ends thereof, and a notch in a middle of an upper portion thereof; and
   a pair of clips, each clip defining a pressing portion abutting against the heat sink, two legs extending downwardly from two opposite ends thereof and latchably engaged with the corresponding catches, a wing downwardly extending from a lateral edge of the pressing portion and a tab downwardly from another lateral edge opposite to said lateral edge, the pressing portion having a side portion near the wing, the side portion being restrictively received within the corresponding notch, thereby preventing the each clip from moving along a longitudinal direction thereof; wherein
   the wing abuts against the corresponding retention module while the tab is engageably received within a slot in the heat sink, which extends along the longitudinal direction of the each clip.

7. The heat dissipating assembly as recited in claim 6, wherein the side portion of the pressing portion of the each clip is horizontal.

8. A heat dissipating assembly comprising:
   a heat sink positioned upon an electronic device;
   a pair of retention modules positioned by two sides of the electronic device, each of said modules defining a pair of catches at two respective opposite ends thereof, and a notch in a middle of an upper portion thereof; and
   a pair of clips, each clip defining a pressing portion abutting against the heat sink, two legs extending downwardly from two opposite ends of the each clip and latchably engaged with the corresponding catches, and a wing extending downwardly from a lateral edge of the pressing portion; wherein
   the wing abuts against the corresponding retention module while a side portion of the pressing portion from where the wing downwardly extends is engageably received within the corresponding notch, thereby preventing the each clip from moving along a longitudinal direction thereof.

9. The heat dissipating assembly as recited in claim 8, wherein the side portion of the pressing portion of the each clip is horizontal.

* * * * *